United States Patent [19]

Grüning et al.

[11] Patent Number: 5,063,436
[45] Date of Patent: Nov. 5, 1991

[54] PRESSURE-CONTACTED SEMICONDUCTOR COMPONENT

[75] Inventors: Horst Grüning, Baden; Helmut Keser, Birr, both of Switzerland

[73] Assignee: Asea Brown Boveri Ltd., Baden, Switzerland

[21] Appl. No.: 660,988

[22] Filed: Feb. 27, 1991

Related U.S. Application Data

[63] Continuation of Ser. No. 459,314, Dec. 29, 1989, abandoned.

[30] Foreign Application Priority Data

Feb. 2, 1989 [CH] Switzerland ............... 358/89

[51] Int. Cl.⁵ ............... H01L 29/74; H01L 23/48; H01L 29/40; H01L 23/42
[52] U.S. Cl. .................. 357/79; 357/65; 357/68; 357/38; 357/71
[58] Field of Search ............ 357/38, 79, 65, 68, 357/71

[56] References Cited

U.S. PATENT DOCUMENTS

| | | | |
|---|---|---|---|
| 3,935,501 | 1/1976 | Sterbal ...................... | 357/75 |
| 4,218,695 | 8/1980 | Eberbacher et al. ........ | 357/75 |
| 4,354,121 | 10/1982 | Terasawa et al. .......... | 307/633 |
| 4,402,004 | 8/1983 | Iwasaki ...................... | 357/75 |
| 4,492,975 | 1/1985 | Yamada et al. ............ | 357/79 |
| 4,500,907 | 2/1985 | Takigami et al. .......... | 357/79 |
| 4,542,398 | 9/1985 | Yatsuo et al. .............. | 357/38 |
| 4,547,686 | 10/1985 | Chen ......................... | 307/570 |
| 4,626,888 | 12/1986 | Nagano et al. ............. | 357/38 |
| 4,639,759 | 1/1987 | Neidig et al. .............. | 357/75 |
| 4,649,416 | 3/1987 | Burkowski et al. ........ | 357/75 |
| 4,651,035 | 3/1987 | Shigekane ................... | 307/570 |
| 4,663,547 | 5/1987 | Baliga et al. ............... | 307/570 |
| 4,710,792 | 12/1987 | Suzuki ........................ | 357/38 |
| 4,724,475 | 2/1988 | Matsuda ..................... | 357/79 |
| 4,752,705 | 6/1988 | Tsuruta et al. ............. | 307/633 |
| 4,849,800 | 7/1989 | Abbas et al. ............... | 357/38 |
| 4,862,239 | 9/1989 | Broich et al. .............. | 357/38 |
| 4,910,573 | 3/1990 | Roggwiller ................ | 357/38 |

FOREIGN PATENT DOCUMENTS

| | | | |
|---|---|---|---|
| 0014761 | 9/1980 | European Pat. Off. ..... | 357/79 |
| 0080953 | 6/1983 | European Pat. Off. ..... | 357/79 |
| 0098175 | 1/1984 | European Pat. Off. ..... | 357/79 |
| 0146928 | 7/1985 | European Pat. Off. ..... | 357/38 |
| 0254910 | 2/1988 | European Pat. Off. ..... | 357/79 |
| 0283588 | 9/1988 | European Pat. Off. ..... | 307/633 |
| 0285074 | 10/1988 | European Pat. Off. ..... | 357/79 |
| 3211975 | 10/1982 | Fed. Rep. of Germany | 357/75 |
| 3346833 | 7/1984 | Fed. Rep. of Germany | 357/75 |
| 54-57984 | 5/1979 | Japan ......................... | 357/75 |
| 59-215762 | 12/1984 | Japan ......................... | 357/75 |
| 582425 | 11/1976 | Switzerland ................ | 357/79 |
| 8701866 | 3/1987 | World Int. Prop. O. ... | 357/79 |

OTHER PUBLICATIONS

H. Matsuda, T. Fujiwara and K. Nishitani; Design Optimization for Improving High Power GTO Switching Characteristics with 'Alloy Free Technology'; pp. 240-245.

Primary Examiner—Andrew J. James
Assistant Examiner—Cynthia S. Deal
Attorney, Agent, or Firm—Oblon, Spivak, McClelland, Maier & Neustadt

[57] ABSTRACT

In a pressure-contacted large-area power semiconductor element, in which a substrate (1) is compressed between an anode-side (20) and a cathode-side compression plate (19), an improved contact is obtained by arranging, at least between one of the compression plates (19,20) and the associated contact (2,9), a metal foil (17) which is soldered to this contact.

8 Claims, 2 Drawing Sheets

PRESSURE-CONTACTED SEMICONDUCTOR COMPONENT

This application is a continuation of application Ser. No. 07/459,314, filed on 12/29/89, now abandoned.

BACKGROUND OF THE INVENTION

1. Field of the Invention

The present invention is concerned with the field of power electronics. In particular it relates to a pressure-contacted power semiconductor component, comprising a) a substrate with an anode side and a cathode side;
b) inside the substrate, between the anode side and the cathode side, a series of differently doped layers;
c) an anode contact on the anode side of the substrate;
d) a cathode contact on the cathode side of the substrate;
e) a cathode-side compression plate, which presses against the cathode side of the substrate; and
f) an anode-side compression plate, which presses against the anode side of the substrate.

Such a component is known in the form of a GTO thyristor, e.g. from EP-A1-0 254 910.

DISCUSSION OF BACKGROUND

Because of the different expansion of Si and the metal of a corresponding contact, a large-area power semiconductor component (diameter>20 mm) can no longer be directly soldered to this contact.

For this reason, contacting of such components has until now been performed by two different methods: the alloy contact and the direct pressure contact (floating silicon).

In the alloy contact (for which see e.g.: EP-A2-0 146 928), the component is alloyed on one side, preferably that with the unstructured anode, onto a Mo plate, so that a good thermal and electrical contact is obtained.

Due to the high process temperature (>600° C.) however, the connection must be made before the manufacture of the component. In addition, since considerable warping of the Si-Mo system generally arises due to inherent mechanical stresses, production of microstructured components (GTO thyristor and FCTh) with alloy contact in particular presents considerable difficulties.

These difficulties are avoided in the case of the direct pressure contact (see the document cited at the beginning) by manufacturing the component first and then pressing it between two compression plates (normally Mo plates). This places great demands on planarity, the surface quality of the Mo plates and the clamping. Thus, in spite of all precautions, especially under continuous stress (alternating load) and with renewed clamping of the component, contact problems can arise which may lead to the destruction of the component.

SUMMARY OF THE INVENTION

Accordingly, one object of this invention is to provide a novel pressure-contacted power semiconductor component which is distinguished by improved reliability, particularly under variable load.

The object is achieved in the case of a component of the abovementioned type in the following way:

g) a metal foil is arranged between at least one of the compression plates and the associated contact; and i) the metal foil is soldered to the associated contact over its whole surface.

The essence of the invention consists in accomplishing a homogeneous pressure distribution and at the same time improving the thermal and electrical contact by means of a thin, soldered-on metal foil between at least one of the compression plates and the substrate.

A first exemplary embodiment is distinguished by the metal foil being constructed as a fine screen with a large number of holes distributed over its surface.

By means of the screen structure of the metal foil, cavities are avoided during soldering and thermal stresses are reduced between the substrate and the foil.

A further exemplary embodiment is distinguished by
a) the metal foil consisting largely of a metal from the Cu, Mo and trivalent metal series; and
b) the thickness of the metal foil being a few 1/10 mm.

The soldered-on metal foil provides particular advantages in the case of components with a highly structured cathode side (cathode fingers), namely in the case of a GTO thyristor or a field-controlled thyristor (FCTh).

Further exemplary embodiments follow from the subclaims.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE PREFERRED EMBODIMENTS

Henceforth, without limiting its generality, the pressure-contact system defined by the invention will be described using a large-area power FCTh as an example. It is self-evident that the invention can also be applied to other large-area semiconductor components, for example GTOs or else conventional thyristors, transistors or diodes.

Figure 1:
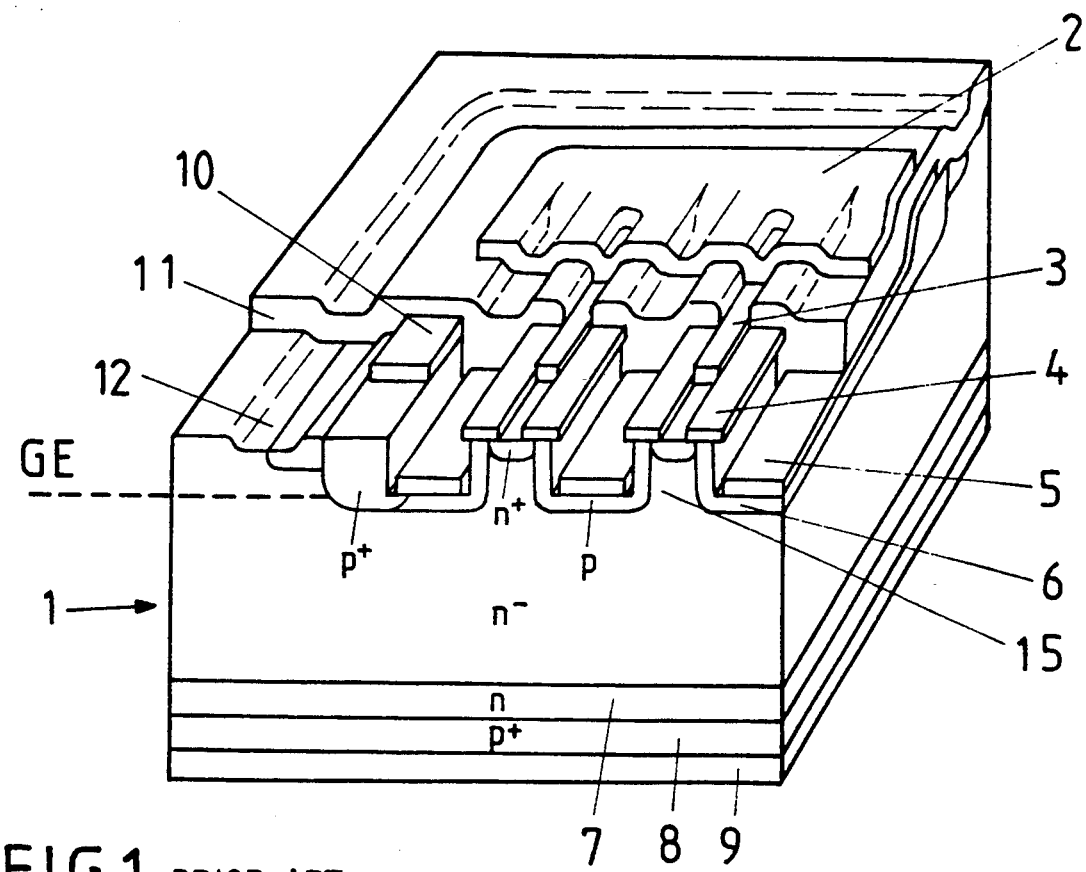
FIG. 1 shows a partial perspective view of the construction of a FCTh according to the current state of the art.

In FIG. 1, a partial perspective view of the construction of a FCTh according to the current state of the art is shown.

Such an FCTh comprises a substrate 1 of lightly n-doped Si, containing on its (lower) anode side a $p^+$-doped anode layer 8, which is contacted with a metallic anode contact 9. In addition, another n-doped buffer layer 7 can be provided above the anode layer 8.

On the (upper) cathode side of the substrate 1 there is provided a large number of elongate cathode fingers 15, which project out of a deeper-lying gate level GE. Within the cathode fingers 15, the $n^-$-doped substrate material forms together with the adjacent p-doped gate regions 6 a field-effect-controlled longitudinal channel in each case, whose mode of operation is sufficiently well known from the literature and hence will not be further described here.

The cathode fingers 15 are connected via a cathode metallization 3 to a cathode contact 2. The gate regions 6 are in connection with a gate contact 10 via a gate metallization 5 in the gate level GE.

Cathode contact 2 and gate contact 10 as well as gate metallization 5 are separated electrically from one another by a passivation layer 11. To increase the dielectric strength there is an edge-termination 12 provided at the edge of the component, in the form of a trench.

An FCTh element, as is shown in FIG. 1, can comprise e.g. two parallel rows of 50 cathode fingers each, thus forming a thyristor element of relatively low power.

If a large number of such thyristor elements are now integrated side by side in parallel on a relatively large substrate, a large-area high-power FCTh is produced.

Figure 2:
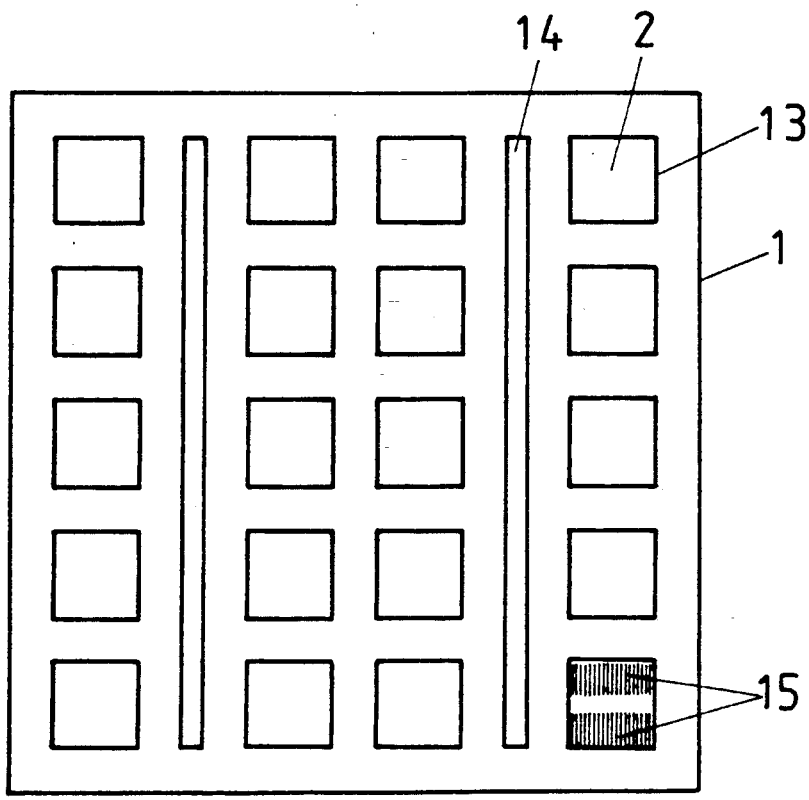
FIG. 2 shows a preferred lateral structure for a power FCTh composed of a plurality of thyristor elements according to FIG. 1.

The lateral structure of such an FCTh, which is to be used to explain the invention, is reproduced in FIG. 2. The substrate 1 in this example contains on a surface area of $23 \times 23$ mm$^2$ a total of 20 thyristor elements 13 in four rows of five individual elements each, which in turn exhibit respectively $2 \times 50$ cathode fingers 15 and have an edge length of about 3 mm.

Each thyristor element 13 has an internal structure according to FIG. 1 and is provided with its own cathode contact 2. Between two rows of thyristor elements 13 there are arranged elongate gate contacts 14, which are in contact with the gate metallizations of the adjacent thyristor elements.

Figure 5:
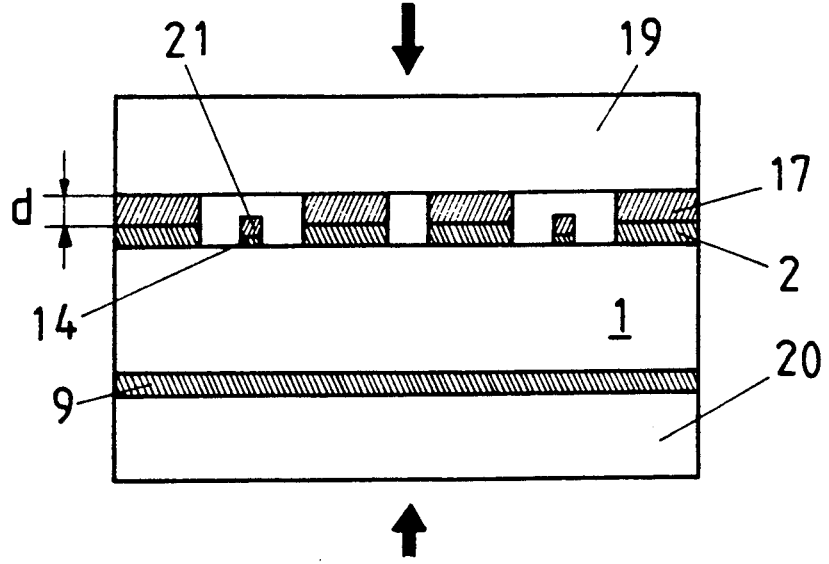
FIG. 5 shows in section the finished pressure-contacted arrangement with a component according to FIG. 2 and a cathode-side metal foil according to FIG. 3.

Mounting and contacting of an FCTh according to FIG. 2 are performed for a preferred embodiment of the invention by the method shown in FIG. 5:

The large-area substrate 1, with the common anode contact 9 on the anode side and the individual cathode contacts 2 of the thyristor elements on the cathode side, is clamped between two compression plates 19 and 20 and is subjected to a pressure in the direction of the arrows drawn in.

In the case of the embodiment shown in FIG. 5, the anode-side compression plate 20 presses directly against the anode contact 9 covering the whole surface, and thus produces the electrical and thermal connection with the substrate 1.

The cathode-side compression plate 19 on the other hand does not press directly against the various cathode contacts 2, but against a metal foil 17, arranged between the compression plate 19 and the cathode contacts 2 and soldered to the cathode contacts over its whole surface.

The deeper-lying gate contacts 14, positioned between the rows of thyristor elements, are likewise soldered for connection purposes soldered to a metal foil 21, whose thickness is chosen such that an adequate interval exists between it and the cathode-side compression plate 19.

The arrangement according to FIG. 5 represents altogether a combined solder-pressure contact:

By means of the soldered-on metal foil 17, all of the thyristor elements on the cathode side are first of all connected together reliably and independently of the clamping pressure. It is only the sandwich formed by the substrate 1 and the soldered-on metal foil 17 that is then brought into a contact system with direct pressure contact known per se.

Contact faults as with the conventional direct pressure contact (without soldered-on metal foil) are thus virtually eliminated, and the component displays satisfactory properties even at considerably lower contact pressures. Overall, a marked increase in reliability is obtained with significantly lower clamping effort.

Some points should be noted with regard to the large-area soldering of the metal foil 17 onto the cathode surfaces 2:

Tests have shown that such large-area components can be reliably soldered with thin metal foils, if the latter are provided with expansion joints, and possibly with holes, to avoid trapping gases during soldering.

On the other hand, conventional solder layers are already intrinsically essentially stable under the operating conditions occurring in a pressure-contacted power semiconductor—elevated pressure (up to 8 N/mm$^2$) and elevated temperature (up to more than 125° C.). Moreover, the flow of the solder under pressure can be further decreased by deliberately reducing the size of the solder joint.

Figure 3:
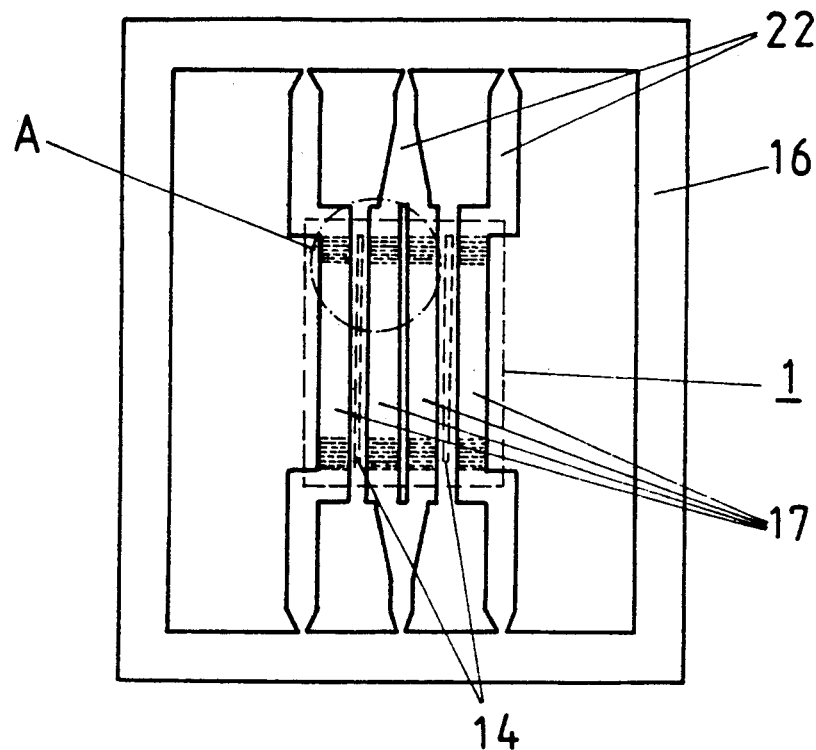
FIG. 3 shows a metal foil used for cathode contacting of the FCTh according to FIG. 2, in accordance with a preferred exemplary embodiment of the invention.
Figure 4:
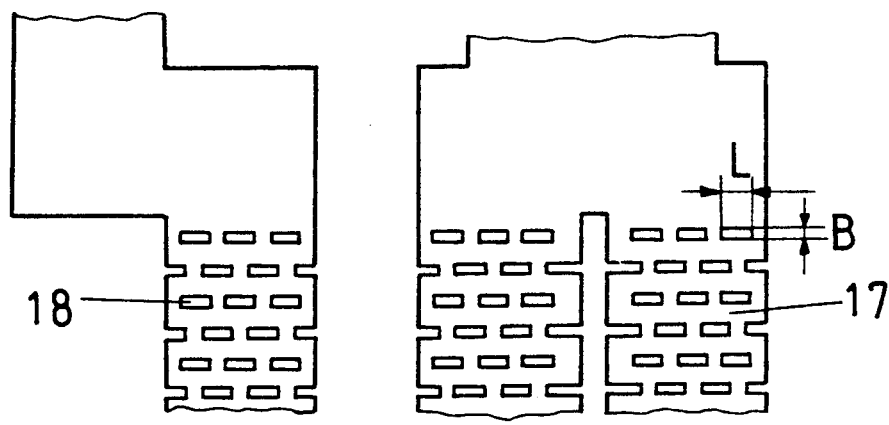
FIG. 4 shows a segment of the screen structure of a metal foil according to FIG. 3.

To avoid cavities during soldering and reduce the thermal stresses between the Si substrate and the metal foil, the foil is preferably formed (e.g. by means of appropriate etching) as a fine screen with a multitude of screen holes 18 distributed over its surface, with a width B and length L (FIGS. 3 and 4). At the same time, by means of the screen structure, simple visual checking of the soldering is possible.

If the metal foil structured thus is pressed onto the Si substrate during the soldering process, then the solder must flow into the screen holes 18. By suitable choice of solder quantity, mesh width and thickness d of the screen-shaped metal foil, any ensuing leakage of solder can be prevented, so that a minimal solder joint is obtained between foil and Si substrate, as well as a solder junction in the edges of the screen holes 18, and optimal plane-parallelism of the outer surfaces. The pressure of the pressure contact is then no longer exerted on the solder, but is transmitted from the foil almost directly onto the Si substrate.

When a screen-shaped metal foil is employed, solder pastes can also be used, since outgasses from these cannot lead to the formation of cavities. Complicated positioning of solder foil and contact material, especially when there are separate junctions on one surface (e.g. gate, cathode), is not necessary if the solder paste is applied to the Si substrate by silk-screen printing.

In FIG. 3, the way in which the screen-shaped metal foils 17 are applied to the cathode side of a substrate 1 according to FIG. 2 is shown for a preferred exemplary embodiment of the invention. The metal foils 17 are part of a foil configuration which is, for example punched and which comprises a frame 16. The metal foils 17 are connected to the frame 16 via connecting lugs 22 and in this way correctly positioned for soldering.

By the soldering, the five thyristor elements 13 of each row are connected to one another on the cathode side by means of the respective metal foil 17. The connecting lugs 22 can be removed after soldering.

In FIG. 3, A designates a segment which is shown enlarged in FIG. 4 and deals specifically with the nature and arrangement of the screen holes 18 in the metal foils 17. In the exemplary embodiment of FIG. 4, the screen holes 18 are realized as rectangular slots with length L (e.g.: L=0.6 mm) and width B (e.g.: B=0.2 mm).

As is clear from a comparison of FIGS. 2–4, the rectangular screen holes 18 are arranged at right angles to the cathode fingers 15. The width B is hence preferably chosen to be smaller than the length of the cathode fingers 15. Thus, optimal pressure distribution and contact closure are obtained for the highly structured cathode side of the FCTh (or GTO).

The metal foils 17 preferably consist primarily of a metal from the Cu, Mo and trivalent metal series. Their thickness d is then only a few 1/10 mm, more precisely about 0.2 mm. Metal foils 17 which have proved particularly successful consist primarily of Cu, and are coated on the solder side with a series of layers of Cr, Ni and Au.

For the solder, a Pb-In solder has proved successful, as it exhibits good performance under alternating load due to the Pb component, and is easily solderable due to the In component.

Minimization of the warping which occurs during soldering is obtained by employing metal foils on both sides. A sandwich is formed, which if necessary can even be mechanically reworked (grinding, polishing). When using polished compression plates 19, 20, one can expect improved heat transfer between the substrate 1 and the compression plates.

If, furthermore, materials and/or surface treatments which enhance the anti-friction properties are chosen for the two sliding components, the soldered-on foil and the compression plate, then the shearing forces occurring under alternating load can largely be avoided. A significant increase in reliability is thus obtained.

In all, improved contacting of large-area power semiconductor components is obtained with the invention, which benefits their behavior under alternating load.

Obviously, numerous modifications and variations of the present invention are possible in the light of the above teachings. It is therefore to be understood that, within the scope of the appended claims, the invention may be practiced otherwise than as specifically described herein.

What is claimed as new and desired to be secured by Letters Patent of the United States is:

1. A pressure-contacted power-semiconductor component comprising:
    a substantially disk-like semiconductor substrate having an anode side surface and a cathode side surface;
    a series of differently doped layers positioned inside said semiconductor substrate between said anode side surface and said cathode side surface, and forming a field-controlled thyristor;
    said field-controlled thyristor having, on said cathode side, a large number of cathode fingers, which are elongate with a first length in one direction, and which project out of a deeper-lying gate level;
    an anode contact in the form of a metallization layer extending on said anode side surface of said semiconductor substrate;
    a cathode contact extending over said cathode fingers on said cathode side surface of said semiconductor substrate;
    an anode compression plate and a cathode compression plate, respectively positioned at said anode and cathode contacts, between which said semiconductor substrate, with said anode and cathode contacts, is positioned and held by clamping; and
    a thin metal foil arranged between said cathode-side compression plate and said cathode contact, said thin metal foil being soldered to said cathode contact over an entire surface thereof to provide homogeneous pressure distribution, wherein said metal foil is constructed in the form of a fine screen with a large number of screen holes distributed over a surface thereof, the holes being filled with solder so that pressure of the compression plates is transmitted from the foil substantially directly onto the substrate.

2. A pressure-contacted power-semiconductor component comprising:
    a substantially disk-like semiconductor substrate having an anode side surface and a cathode side surface;
    a series of differently doped layers positioned inside said semiconductor substrate between said anode side surface and said cathode side surface, and forming a gate turn-off thyristor;
    said gate turn-off thyristor having, on said cathode side, a large number of cathode fingers, which are elongate with a first length in one direction, and which project out of a deeper-lying gate level;
    an anode contact in the form of a metallization layer extending on said anode side surface of said semiconductor substrate;
    a cathode contact extending over said cathode fingers on said cathode side surface of said semiconductor substrate;
    an anode compression plate and a cathode compression plate, respectively positioned at said anode and cathode contacts, between which said semiconductor substrate, with said anode and cathode contacts, is positioned and held by clamping; and
    a thin metal foil arranged between said cathode-side compression plate and said cathode contact, said thin metal foil being soldered to said cathode contact over an entire surface thereof to provide homogeneous pressure distribution, wherein said metal foil is constructed in the form of a fine screen with a large number of screen holes distributed over a surface thereof, the holes being filled with solder so that pressure of the compression plates is transmitted from the foil substantially directly onto the substrate.

3. A component as claimed in claims 1 or 2, wherein said metal foil consists primarily of a metal from the Cu, Mo and trivalent metal series; and a thickness of said metal foil is at least about 1/10 mm.

4. A component as claimed in claim 3, wherein said thickness of said metal foil is about 0.2 mm.

5. A component as claimed in claim 3, wherein:
    said metal foil consists primarily of Cu; and
    said metal foil is coated on a solder side thereof with a series of layers of Cr, Ni and Au.

6. A component as claimed in claim 1, wherein:
    said metal foil has rectangular screen holes with a width and a second length greater than said width;
    said metal foil is positioned such that said screen holes run with said second length at right angles to said elongate direction of said cathode fingers; and
    said width of said screen holes is smaller than said first length of said cathode fingers.

7. A component as claimed in claim 2, wherein:
    said metal foil has rectangular screen holes with a width and a second length greater than said width;
    said metal foil is positioned such that said screen holes run with said second length at right angles to said elongate direction of said cathode fingers; and
    said width of said screen holes is smaller than said first length of said cathode fingers.

8. A component as claimed in claims 1 or 2, wherein a Pb-In solder is employed as a solder.

* * * * *